(12) United States Patent
Kabbani et al.

(10) Patent No.: US 12,540,967 B2
(45) Date of Patent: Feb. 3, 2026

(54) WAFER SCALE ACTIVE THERMAL INTERPOSER FOR DEVICE TESTING

(71) Applicant: Advantest Test Solutions, Inc., San Jose, CA (US)

(72) Inventors: Samer Kabbani, San Jose, CA (US); Paul Ferrari, San Jose, CA (US); Ikeda Hiroki, San Jose, CA (US); Kiyokawa Toshiyuki, San Jose, CA (US); Gregory Cruzan, San Jose, CA (US); Karthik Ranganathan, San Jose, CA (US)

(73) Assignee: Advantest Test Solutions, Inc, San Jose, CA (US)

( * ) Notice: Subject to any disclaimer, the term of this patent is extended or adjusted under 35 U.S.C. 154(b) by 0 days.

(21) Appl. No.: 19/201,163

(22) Filed: May 7, 2025

(65) Prior Publication Data

US 2025/0264525 A1 Aug. 21, 2025

Related U.S. Application Data

(63) Continuation of application No. 18/999,948, filed on Dec. 23, 2024, which is a continuation of application (Continued)

(51) Int. Cl.
*G01R 31/28* (2006.01)
*G01R 31/3185* (2006.01)
*H01L 23/473* (2006.01)

(52) U.S. Cl.
CPC .. *G01R 31/2887* (2013.01); *G01R 31/318511* (2013.01); *H01L 23/473* (2013.01); *F28F 2260/02* (2013.01)

(58) Field of Classification Search
CPC .... G01R 31/28; G01R 31/31937; H01L 22/00
See application file for complete search history.

(56) References Cited

U.S. PATENT DOCUMENTS 5,126,656 A 6/1992 Jones
5,164,661 A 11/1992 Jones
(Continued)

FOREIGN PATENT DOCUMENTS

CN 101073016 A 11/2007
CN 102109537 6/2011
(Continued)

OTHER PUBLICATIONS

Ranganathan et al. D517: Shielded Socket and Carrier for High-Volume Test of Semiconductor Devices; Powerpoint; 12 pp. Sep. 30, 2021.

*Primary Examiner* — Raul J Rios Russo
*Assistant Examiner* — Temilade S Rhodes-Vivour

(57) ABSTRACT

A system for testing circuits of an integrated circuit semiconductor wafer includes a test stack for use in testing circuits of an integrated circuit component includes a top surface configured to receive the component in proximity thereto, a plurality of independently controllable thermal zones including a plurality of independently controllable heating zones and a plurality of independently controllable cooling zones configured to maintain or change temperatures on the top surface, and a power input configured to receive electrical power and wherein the electrical power is configured to be selectively applied to one or more of the plurality of independently controllable heating zones.

30 Claims, 9 Drawing Sheets

Related U.S. Application Data

No. 17/528,002, filed on Nov. 16, 2021, now Pat. No. 12,320,841.

(60) Provisional application No. 63/115,813, filed on Nov. 19, 2020.

(56) References Cited

U.S. PATENT DOCUMENTS

| | | |
|---|---|---|
| 5,239,093 A | 8/1993 | Cheng |
| 5,315,240 A | 5/1994 | Jones |
| 5,329,093 A | 7/1994 | Okano |
| 5,420,521 A | 5/1995 | Jones |
| 5,738,531 A | 4/1998 | Beaman et al. |
| 5,821,505 A | 10/1998 | Tustaniwskyj et al. |
| 5,909,657 A | 6/1999 | Onishi et al. |
| 6,184,504 B1 | 2/2001 | Cardella |
| 6,359,264 B1 | 3/2002 | Schaper et al. |
| 6,389,225 B1 | 5/2002 | Malinoski et al. |
| 6,452,113 B2 | 9/2002 | Dibene, II et al. |
| 6,498,899 B2 | 12/2002 | Malinoski et al. |
| 6,507,205 B1 | 1/2003 | Dibish et al. |
| 6,515,470 B2 | 2/2003 | Suzuki et al. |
| 6,668,570 B2 | 12/2003 | Wall et al. |
| 6,711,904 B1 | 3/2004 | Law et al. |
| 6,825,681 B2 | 11/2004 | Feder et al. |
| 6,862,405 B2 | 3/2005 | Malinoski et al. |
| 6,985,000 B2 | 1/2006 | Feder et al. |
| 7,042,240 B2 | 5/2006 | Lopez et al. |
| 7,126,217 B2 | 10/2006 | Chiu et al. |
| 7,138,811 B1 | 11/2006 | Mahoney et al. |
| 7,151,388 B2 | 12/2006 | Gopal et al. |
| 7,311,782 B2 | 12/2007 | Strang et al. |
| 7,355,428 B2 | 4/2008 | Kabbani et al. |
| 7,411,792 B2 | 8/2008 | Richards et al. |
| 7,436,059 B1 | 10/2008 | Ouyang |
| 7,519,880 B1 | 4/2009 | Johnson et al. |
| 7,626,407 B2 | 12/2009 | Kabbani |
| 7,646,596 B2 | 1/2010 | Ng |
| 7,659,738 B2 | 2/2010 | Hong |
| 7,726,145 B2 | 6/2010 | Nakamura |
| 7,755,899 B2 | 7/2010 | Stenmark |
| 7,781,883 B2 | 8/2010 | Sri-Jayantha et al. |
| 7,830,164 B2 | 11/2010 | Earle et al. |
| 7,848,106 B2 | 12/2010 | Merrow |
| 7,929,303 B1 | 4/2011 | Merrow |
| 8,343,280 B2 | 1/2013 | Iimuro |
| 8,558,540 B2 | 10/2013 | Wu et al. |
| 8,653,843 B2 | 2/2014 | Ando et al. |
| 8,772,682 B2 | 7/2014 | Ambal et al. |
| 8,927,907 B2 | 1/2015 | Fink et al. |
| 8,970,244 B2 | 3/2015 | Suzuki et al. |
| 9,080,820 B2 | 7/2015 | Bolton |
| 9,291,667 B2 | 3/2016 | Armstrong et al. |
| 9,307,578 B2 | 4/2016 | Pease |
| 9,310,145 B2 | 4/2016 | Colongo et al. |
| 9,400,291 B2 | 7/2016 | Johnson et al. |
| 9,414,526 B2 | 8/2016 | Mann et al. |
| 9,494,353 B2 | 11/2016 | Yu et al. |
| 9,513,005 B2 | 12/2016 | Schneider |
| 9,594,113 B2 | 3/2017 | Davis et al. |
| 9,698,132 B1 | 7/2017 | Ady |
| 9,709,622 B2 | 7/2017 | Lopez et al. |
| 9,766,287 B2 | 9/2017 | Narasaki et al. |
| 9,841,772 B2 | 12/2017 | Bucher |
| 10,056,225 B2 | 8/2018 | Gaff et al. |
| 10,126,356 B2 | 11/2018 | Barabi et al. |
| 10,163,668 B2 | 12/2018 | Steinhauser |
| 10,354,785 B2 | 7/2019 | Yamaguchi |
| 10,656,200 B2 | 5/2020 | Cruzan et al. |
| 10,775,408 B2 | 9/2020 | Carvalho et al. |
| 10,908,207 B2 | 2/2021 | Barabi et al. |
| 10,955,466 B2 | 3/2021 | Tsai et al. |
| 10,983,145 B2 | 4/2021 | Akers et al. |
| 11,003,200 B1 | 5/2021 | Roland |
| 11,143,697 B2 | 10/2021 | Wolff |
| 11,493,551 B2 | 11/2022 | Ranganathan et al. |
| 2002/0026258 A1 | 2/2002 | Suzuki et al. |
| 2002/0118032 A1 | 8/2002 | Norris et al. |
| 2003/0155939 A1 | 8/2003 | Lutz et al. |
| 2004/0017185 A1 | 1/2004 | Song et al. |
| 2005/0026476 A1 | 2/2005 | Mok et al. |
| 2005/0040838 A1 | 2/2005 | Cannon |
| 2005/0086948 A1 | 4/2005 | Milke-Rojo et al. |
| 2005/0103034 A1 | 5/2005 | Hamilton et al. |
| 2005/0151553 A1 | 7/2005 | Kabbani et al. |
| 2005/0169733 A1 | 8/2005 | Drynkin et al. |
| 2006/0158207 A1 | 7/2006 | Reitinger |
| 2006/0247881 A1* | 11/2006 | Laquai ............ G01R 31/31725 |
| | | 702/117 |
| 2006/0290370 A1 | 12/2006 | Lopez |
| 2008/0083744 A1* | 4/2008 | Ruiz ..................... H05B 3/265 |
| | | 219/541 |
| 2008/0234961 A1* | 9/2008 | Tanaka ............ G01R 31/31922 |
| | | 702/82 |
| 2009/0121738 A1* | 5/2009 | Narikawa ........ G01R 31/31932 |
| | | 324/762.01 |
| 2009/0160472 A1 | 6/2009 | Segawa et al. |
| 2009/0218087 A1 | 9/2009 | Oshima |
| 2010/0032789 A1 | 2/2010 | Schoen et al. |
| 2010/0042355 A1 | 2/2010 | Aube et al. |
| 2010/0052708 A1 | 3/2010 | Ribeiro et al. |
| 2010/0155588 A1 | 6/2010 | Christo |
| 2010/0155888 A1 | 6/2010 | Christo et al. |
| 2010/0244852 A1* | 9/2010 | Habu ............... G01R 31/31932 |
| | | 702/85 |
| 2011/0050268 A1 | 3/2011 | Co et al. |
| 2011/0074080 A1 | 3/2011 | Di Stefano et al. |
| 2012/0264320 A1 | 10/2012 | Parrish |
| 2013/0181576 A1 | 7/2013 | Shiozawa et al. |
| 2013/0285686 A1* | 10/2013 | Malik ................ G01R 31/2875 |
| | | 324/750.05 |
| 2014/0035715 A1 | 2/2014 | Takahashi et al. |
| 2014/0251214 A1 | 9/2014 | Cuvalci et al. |
| 2015/0028908 A1 | 1/2015 | Kushnick et al. |
| 2015/0028912 A1 | 1/2015 | Cho et al. |
| 2015/0035554 A1 | 2/2015 | Dang |
| 2015/0137842 A1 | 5/2015 | Murakami et al. |
| 2015/0168450 A1 | 6/2015 | Wooden et al. |
| 2015/0226794 A1 | 8/2015 | Chen |
| 2015/0300719 A1 | 10/2015 | Strickland |
| 2015/0309114 A1 | 10/2015 | Barabi |
| 2016/0084880 A1 | 3/2016 | Locicero et al. |
| 2016/0247552 A1 | 8/2016 | Kim et al. |
| 2016/0351526 A1 | 12/2016 | Boyd et al. |
| 2017/0059635 A1 | 3/2017 | Orchanian et al. |
| 2017/0102409 A1 | 4/2017 | Sarhad et al. |
| 2018/0024188 A1 | 1/2018 | Cruzan et al. |
| 2018/0156863 A1 | 6/2018 | Song |
| 2018/0189159 A1 | 7/2018 | Carmichael et al. |
| 2018/0218926 A1 | 8/2018 | Stuckey et al. |
| 2018/0301420 A1* | 10/2018 | Kim ..................... H01L 21/4885 |
| 2019/0064254 A1 | 2/2019 | Bowyer et al. |
| 2019/0064261 A1 | 2/2019 | Bowyer et al. |
| 2019/0162777 A1 | 5/2019 | Chiang et al. |
| 2019/0271719 A1 | 9/2019 | Sterzbach |
| 2019/0310314 A1 | 10/2019 | Liu et al. |
| 2019/0346482 A1 | 11/2019 | Kiyokawa et al. |
| 2020/0041564 A1 | 2/2020 | Cojoneanu et al. |
| 2020/0058853 A1 | 2/2020 | Slovin |
| 2020/0174053 A1 | 6/2020 | Gondi et al. |
| 2020/0363104 A1 | 11/2020 | Macdonald et al. |
| 2020/0371155 A1 | 11/2020 | Walczyk et al. |
| 2021/0071917 A1 | 3/2021 | Pei et al. |
| 2021/0183668 A1 | 6/2021 | Cagle et al. |
| 2021/0293495 A1 | 9/2021 | Barako et al. |
| 2021/0366771 A1 | 11/2021 | Sreenivasan et al. |
| 2021/0396801 A1 | 12/2021 | Ranganathan et al. |
| 2022/0044084 A1 | 2/2022 | Cardy |
| 2022/0082587 A1 | 3/2022 | Gopal et al. |
| 2022/0128597 A1 | 4/2022 | Mckenna et al. |
| 2022/0128599 A1 | 4/2022 | Campbell et al. |
| 2022/0137092 A1 | 5/2022 | Ranganathan et al. |
| 2022/0137129 A1 | 5/2022 | Ranganathan et al. |

(56) References Cited

U.S. PATENT DOCUMENTS

| | | |
|---|---|---|
| 2022/0206061 A1 | 6/2022 | Ranganathan et al. |
| 2022/0284982 A1 | 9/2022 | Ranganathan et al. |
| 2023/0296667 A1 | 9/2023 | Ranganathan et al. |

FOREIGN PATENT DOCUMENTS

| | | |
|---|---|---|
| CN | 103038751 A | 4/2013 |
| CN | 105144114 A | 12/2015 |
| CN | 109716513 A | 5/2019 |
| CN | 110214270 A | 9/2019 |
| CN | 110618903 A | 12/2019 |
| EP | 3270261 A1 | 4/2023 |
| JP | 2005156172 A | 6/2005 |
| JP | 2007248317 | 9/2007 |
| JP | 2008275512 A | 11/2008 |
| KR | 20070027524 | 3/2007 |
| KR | 20130093262 | 8/2013 |
| KR | 2017-0143458 | 12/2017 |
| KR | 20170137334 | 12/2017 |
| KR | 20180061754 | 6/2018 |
| KR | 20200063664 | 6/2020 |
| KR | 20200089714 | 7/2020 |
| KR | 2022-0068939 | 5/2022 |
| TW | 446682 B | 7/2001 |
| TW | 200535440 A | 11/2005 |
| TW | 200620596 A | 6/2006 |
| TW | 200628818 A | 8/2006 |
| TW | 201226579 A | 7/2012 |
| TW | 201229535 A | 7/2012 |
| TW | 201323883 A | 6/2013 |
| TW | 201504647 A | 7/2013 |
| TW | 201333497 | 8/2013 |
| TW | 201447325 A | 12/2014 |
| TW | 201636618 A | 12/2014 |
| TW | 1651540 B | 1/2016 |
| TW | 201608254 A | 3/2016 |
| TW | 201712459 A | 4/2017 |
| TW | 201834134 A | 9/2018 |
| TW | 201840996 A | 11/2018 |
| TW | 202004980 A | 1/2020 |
| TW | 202043787 A | 12/2020 |
| TW | 202242431 | 11/2022 |
| WO | 2016122039 A1 | 8/2016 |
| WO | 201712076 | 1/2017 |
| WO | 2017015052 A1 | 1/2017 |
| WO | 2017039936 A1 | 3/2017 |
| WO | 2017112076 | 6/2017 |
| WO | 2020159954 A1 | 8/2020 |

\* cited by examiner

750 Start

755 TEST CIRCUITS OF THE WAFER USING A TESTER SYSTEM TO GENERATE SIGNALS FOR INPUT TO THE CIRCUITS AND TO PROCESS OUTPUT SIGNALS FROM THE CIRCUITS

760 IN CONJUNCTION WITH THE TESTING, SELECTIVELY HEAT AND MAINTAIN TEMPERATURE OF A PLURALITY OF AREAS OF THE WAFER USING A THERMAL CONTROLLER CONTROLLING A THERMAL INTERPOSER LAYER AND A COLD PLATE, BOTH DISPOSED IN PROXIMITY OF THE WAFER

765 BRING A FIRST THERMAL ZONE OF THE PLURALITY OF SEPARATELY CONTROLLABLE THERMAL ZONES TO A TESTING TEMPERATURE

770 SIMULTANEOUSLY BRING A SECOND THERMAL ZONE OF THE PLURALITY OF SEPARATELY CONTROLLABLE THERMAL ZONES TO A TESTING TEMPERATURE IN ADVANCE OF TESTING ONE OR MORE DIE OF THE DIE LAYOUT CORRESPONDING TO THE SECOND THERMAL ZONE, WHILE THE TESTER SYSTEM IS TESTING ONE OR MORE DIE OF THE DIE LAYOUT CORRESPONDING TO THE FIRST THERMAL ZONE

775 TEST ONE OR MORE DIE OF THE DIE LAYOUT CORRESPONDING TO THE SECOND THERMAL ZONE

End

Fig. 7B

WAFER SCALE ACTIVE THERMAL INTERPOSER FOR DEVICE TESTING

RELATED APPLICATION(S)

This Application is a Continuation of co-pending, commonly owned U.S. application Ser. No. 18/999,948, filed Dec. 23, 2024, entitled "Wafer Scale Active Thermal Interposer for Device Testing" to Kabbani et al., which in turn was a Continuation of U.S. application Ser. No. 17/528,002, filed Nov. 16, 2021, entitled "Wafer Scale Active Thermal Interposer for Device Testing" to Kabbani et al., which in turn claims priority to U.S. Provisional Application No. 63/115,813, filed Nov. 19, 2020, entitled "Wafer Scale Active Thermal Interposer." This application is related to U.S. Pat. No. 9,291,667 entitled "Adaptive Thermal Control," and is also related to U.S. Pat. No. 11,674,999, entitled "Wafer Scale Active Thermal Interposer for Device Testing" to Kabbani et al. All such Applications and/or Patents are hereby incorporated herein by reference in their entirety.

FIELD OF INVENTION

Embodiments of the present invention relate to the field of integrated circuit manufacturing and test. More specifically, embodiments of the present invention relate to systems and methods for testing integrated circuit devices in wafer embodiments.

BACKGROUND

It is common to subject integrated circuits, either packaged or unpackaged, to environmental testing as an operation in a manufacturing processes. Typically in such testing, the integrated circuit devices are subject to electrical testing, e.g., "test patterns," to confirm functionality while being subjected to environmental stress. For example, an integrated circuit is heated and/or cooled to its specification limits while being electrically tested. In some cases, e.g., for qualification testing, an integrated circuit may be stressed beyond its specifications, for example, to determine failure points and/or establish "guard band" on its environmental specifications.

Traditionally, such testing has included placing one or more integrated circuits and their associated test interface(s) and support hardware into an environmental chamber. The environmental chamber would heat and/or cool the integrated circuit(s) under test, known as or referred to as a device under test, or "DUT," as well as the test interface and support hardware, to the desired test temperature. Unfortunately, use of such test chambers has numerous drawbacks. For example, the limits and/or accuracy of such testing may be degraded due to environmental limits of the test interface circuits and/or devices. In addition, due to the large volumes of air and mass of mounting structures and interface devices required within an environmental test chamber, the environment inside such a test chamber may not be changed rapidly, limiting a rate of testing. Further, placing and removing DUTs and testing apparatus into and out of such test chambers further limits rates of testing, and requires complex and expensive mechanisms to perform such insertions and removals.

Recently, environmental test systems have be created that heat and/or cool a DUT directly, without placing the DUT and test apparatus into an environmental chamber. Such "chamber-less" test systems overcome many of the limitations of chamber-based testing. Unfortunately, chamber-less test systems introduce testing difficulties, particularly related to cooling integrated circuits under test.

Cooling of integrated circuits under test is typically performed by thermally coupling a cooling structure, e.g., metal, to the device under test. A cooling fluid, e.g., comprising glycol, is circulated through a portion of the cooling structure. To adjust the temperature of the cooling structure, the temperature of the cooling fluid may be adjusted. The flow of the cooling fluid may also be adjusted, e.g., increased, reduced, started, and/or stopped.

It is desirable to perform environmental testing at a wafer level, for example, comprising tens to potentially thousands of dice, beneficially increasing manufacturing throughput. In addition, testing at a wafer level may identify defective or sub-standard die at the wafer level, avoiding the expense of additional manufacturing and test operations for such devices.

Unfortunately, precise heating and/or cooling of an individual die within a wafer is not available under the conventional art, rendering wafer-level testing under environmental conditions unavailable.

SUMMARY OF THE INVENTION

Therefore, what is needed are systems and methods for wafer scale active thermal interposer devices. What is additionally needed are systems and methods for wafer scale active thermal interposer devices operable to control different portions of a wafer to different temperatures. There is a further need for systems and methods for wafer scale active thermal interposer devices that are compatible and complementary with existing systems and methods of testing integrated circuits.

In accordance with embodiments of the present invention, a test stack for use in testing circuits of an integrated circuit component includes a top surface configured to receive the component in proximity thereto, a plurality of independently controllable thermal zones including a plurality of independently controllable heating zones and a plurality of independently controllable cooling zones configured to maintain or change temperatures on the top surface, and a power input configured to receive electrical power and wherein the electrical power is configured to be selectively applied to one or more of the plurality of independently controllable heating zones.

Embodiments include the above and wherein the electrical power is supplied by a power supply device coupled to the power input and wherein the power supply device selectively applies the electrical power using pulse width modulation (PWM).

Embodiments include the above and wherein temperatures maintained or changed on the top surface are operable to cause maintaining or changing of temperatures of the component disposed in proximity to the top surface.

Embodiments include the above and wherein the component is a semiconductor wafer including a plurality of discrete dice and wherein further the plurality of discrete dice includes at least one integrated circuit die device under test (DUT).

Embodiments include the above and further include a wafer probe and wherein the wafer probe is configured to electrically couple to a device under test (DUT) of the component during testing thereof.

Embodiments include the above and further include a wafer thermal interposer (TI) including a first conductive layer including the plurality of independently controllable heating zones, wherein the plurality of independently controllable heating zones include one or more resistive traces configured as heat producing elements, and a second conductive layer configured as an electromagnetic interference (EMI) shield layer, wherein the shield layer is located closer to the top surface than the first conductive layer and is electrically coupled to ground.

Embodiments include the above and wherein the first conductive layer of the wafer TI further includes a plurality of heat sensing elements.

Embodiments include the above and wherein the wafer TI is formed from two or more substrates.

Embodiments include the above and further include a wafer thermal interposer (TI) having a top surface configured to be disposed adjacent to the semiconductor wafer and configured to be electrically coupled to ground.

Embodiments include the above and wherein the component is a wafer device under test (DUT) and further include a wafer probe configured to probe circuits of the wafer DUT by probing a first surface of the wafer DUT, a wafer thermal interposer (TI) configured to be disposed in proximity to a second surface of the wafer DUT and further configured to selectively heat areas of the wafer DUT during testing thereof, the wafer TI including the plurality of independently controllable heating zones, a cold plate configured to be disposed in proximity to the wafer TI and configured to selectively cool the wafer DUT, and a thermal controller configured to control selective heating of the wafer TI and configured to control selective cooling of the cold plate.

Embodiments include the above and wherein the cold plate and the wafer TI, in combination, under control of the thermal controller, implement the plurality of independently controllable cooling zones.

Embodiments include the above and wherein the plurality of independently controllable heating zones includes a plurality of resistive traces configured to emit heat responsive to application of the electrical power thereto.

Embodiments include the above and wherein the thermal controller is configured to control electrical power selectively supplied to one or more of the plurality of independently controllable thermal zones to individually control heat produced therefrom.

Embodiments include the above and wherein the wafer TI further includes a plurality of temperature measurement devices configured to measure temperatures of the areas of the wafer DUT.

Embodiments include the above and wherein the wafer TI further includes a shield layer disposed to protect the wafer DUT from electromagnetic interference from the plurality of resistive traces and wherein the shield layer is configured to be grounded.

Embodiments include the above and further including a first thermal interface material (TIM) layer disposed between the cold plate and the wafer TI, and a second TIM layer disposed between the wafer TI and the wafer DUT.

Embodiments include the above and wherein the thermal controller is configured to alter a flow rate of coolant fluid to the cold plate.

Embodiments include the above and wherein the thermal controller is configured to alter a temperature of coolant fluid flowing to the cold plate.

Embodiments include the above and wherein the thermal controller is configured to alter and maintain temperature of a respective thermal zone of the plurality of independently controllable thermal zones by adjusting power supplied to the respective thermal zone and also by adjusting coolant fluid flow to the cold plate, or both.

In accordance with a method embodiment of the present invention, a method of testing an integrated circuit component includes testing the component by applying signals thereto and comparing results therefrom, and regulating temperatures of the component during the testing, the regulating temperatures using a test stack. The test stack includes a top surface configured to receive the component in proximity thereto, a plurality of independently controllable thermal zones including a plurality of independently controllable heating zones and a plurality of independently controllable cooling zones configured to maintain or change temperatures on the top surface, and a power input configured to receive electrical power and wherein the electrical power is configured to be selectively applied to one or more of the plurality of independently controllable heating zones.

Embodiments include the above and wherein the regulating temperatures includes supplying the electrical power using a power supply device coupled to the power input and wherein further the supplying electrical power includes selectively applying the electrical power using pulse width modulation (PWM).

Embodiments include the above and wherein the component is a semiconductor wafer and wherein the semiconductor wafer includes a plurality of discrete dice.

Embodiments include the above and wherein the test stack further includes a wafer probe and wherein the testing includes probing the component using the wafer probe.

Embodiments include the above and wherein the test stack further includes a wafer thermal interposer (TI) including a first conductive layer including the plurality of independently controllable heating zones, wherein the plurality of independently controllable heating zones include one or more resistive traces configured as heat producing elements, and a second conductive layer configured as an electromagnetic interference (EMI) shield layer, wherein the shield layer is disposed to shield the top surface from EMI from the first conductive layer and is further electrically coupled to ground.

Embodiments include the above and wherein the first conductive layer of the wafer TI further includes a plurality of temperature measuring devices.

Embodiments include the above and wherein the test stack further includes a wafer thermal interposer (TI) having a top surface configured to be electrically coupled to ground and wherein the regulating temperatures further includes disposing the semiconductor wafer in proximity to the top surface.

Embodiments include the above and wherein the test stack further includes a wafer probe configured to probe circuits of the component by probing a first surface thereof, a wafer thermal interposer (TI) configured to be disposed in proximity to a second surface of the component and further configured to selectively heat areas of the component during the testing, the wafer TI including the plurality of independently controllable heating zones, a cold plate configured to be disposed in proximity to the wafer TI and configured to selectively cool the component, and a thermal controller configured to control selective heating of the wafer TI and configured to control selective cooling of the cold plate.

Embodiments include the above and wherein the regulating temperatures includes using the thermal controller to control electrical power selectively supplied to one or more of the plurality of independently controllable thermal zones to individually control heat produced therefrom and wherein further the plurality of independently controllable heating zones includes a plurality of resistive traces configured to emit heat responsive to the supplying the electrical power.

Embodiments include the above and wherein the test stack further includes a first thermal interface material (TIM) layer disposed between the cold plate and the wafer TI, and a second TIM layer disposed between the wafer TI and the component.

Embodiments include the above and wherein the regulating temperatures includes altering and maintaining temperatures of a respective thermal zone of the plurality of independently controllable thermal zones using the thermal controller adjusting power supplied to the respective thermal zone and also adjusting coolant fluid flow to the cold plate, or both.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings may not be drawn to scale.

FIG. 7B illustrates an exemplary computer controlled method for testing circuits of an integrated circuit semiconductor wafer using a wafer scale active thermal interposer device, in accordance with embodiments of the present invention.

DETAILED DESCRIPTION

Figure 1:
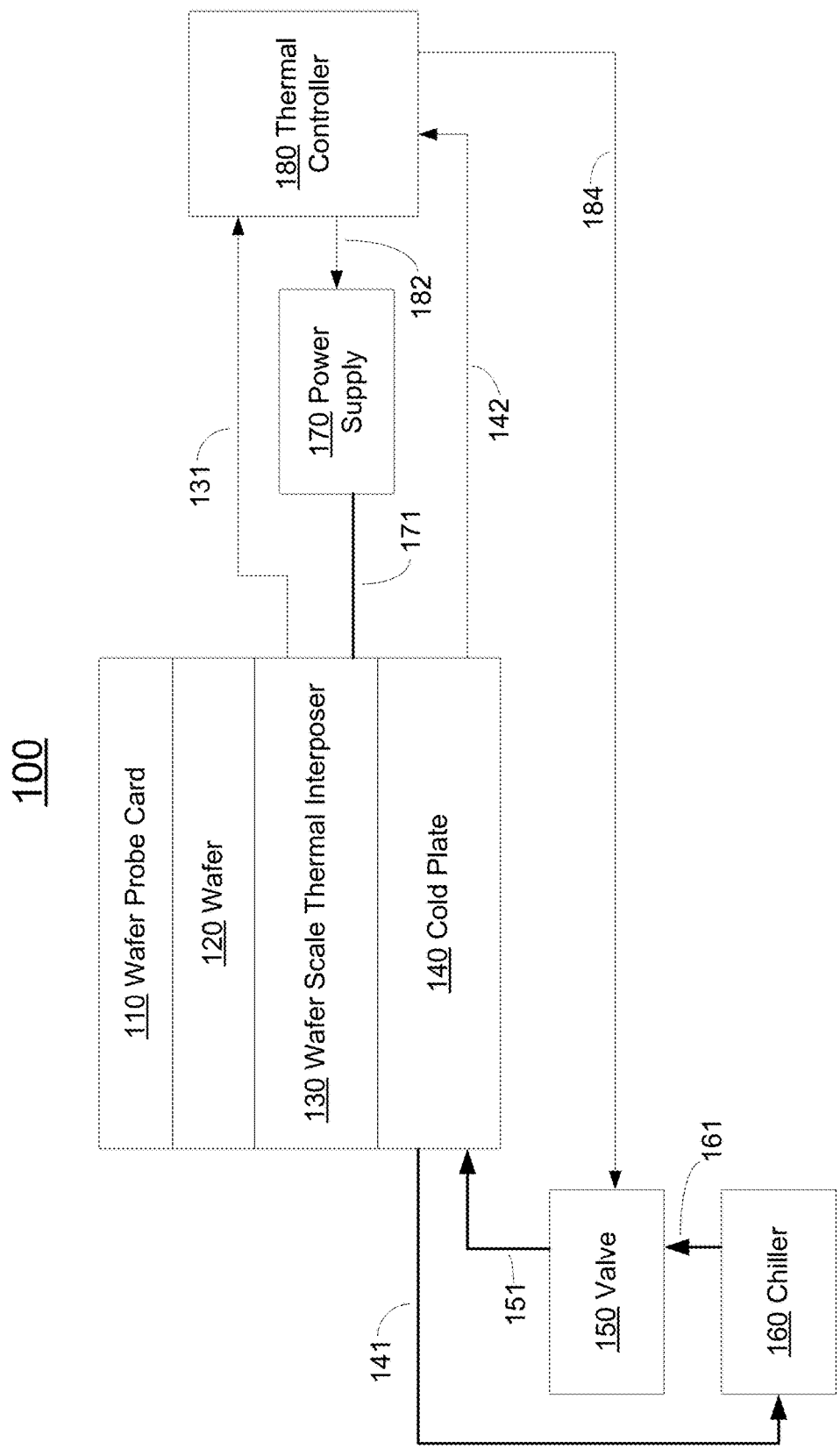
FIG. 1 illustrates an exemplary block diagram of elements of an automated test system environment that may serve as a platform for embodiments in accordance with the present invention.

Reference will now be made in detail to various embodiments of the invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Some portions of the detailed descriptions which follow (e.g., process 700) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, data, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "testing" or "heating" or "maintaining temperature" or "bringing" or "capturing" or "storing" or "reading" or "analyzing" or "generating" or "resolving" or "accepting" or "selecting" or "determining" or "displaying" or "presenting" or "computing" or "sending" or "receiving" or "reducing" or "detecting" or "setting" or "accessing" or "placing" or "testing" or "forming" or "mounting" or "removing" or "ceasing" or "stopping" or "coating" or "processing" or "performing" or "generating" or "adjusting" or "creating" or "executing" or "continuing" or "indexing" or "translating" or "calculating" or "measuring" or "gathering" or "running" or the like, refer to the action and processes of, or under the control of, a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The meaning of "non-transitory computer-readable medium" should be construed to exclude only those types of transitory computer-readable media which were found to fall outside the scope of patentable subject matter under 35 U.S.C. § 101 in In re Nuijten, 500 F.3d 1346, 1356-57 (Fed. Cir. 1007). The use of this term is to be understood to remove only propagating transitory signals per se from the claim scope and does not relinquish rights to all standard computer-readable media that are not only propagating transitory signals per se.

Wafer Scale Active Thermal Interposer for Device Testing

FIG. 1 illustrates an exemplary block diagram of elements of an automated test system environment 100, which utilizes a wafer scale active thermal interposer device, that may serve as a platform for embodiments in accordance with the present invention. Test system 100 receives and tests a semiconductor wafer 120, for example comprising a plurality of integrated circuit devices or dice. A wafer probe card 110 is coupled to wafer 120, e.g., utilizing test pads formed on the wafer 120, to send and receive test signals and power to integrated circuit devices embodied within or on wafer 120. Wafer probe card 110 is typically electronically coupled to, and tests, a single die of wafer 120 at a time, although that is not required.

In accordance with embodiments of the present invention, a novel wafer scale active thermal interposer device 130 is coupled to the backside of wafer 120. Wafer scale active thermal interposer device 130 may be customized for a specific design of wafer 120, in some embodiments. In some embodiments, there may be a thermal interface material (not shown, see FIG. 3) disposed between wafer scale active thermal interposer device 130 and wafer 120. Such a thermal interface material, if present, is designed to improve thermal coupling between wafer scale active thermal interposer device 130 and wafer 120.

In some embodiments, wafer scale active thermal interposer device 130 may comprise a base layer of aluminum nitride (AlN) with tungsten and/or molybdenum traces. A high temperature co-fired ceramic (HTCC) process may be utilized. Such embodiments may be suitable for testing comparatively higher power devices. In some embodiments, a low temperature co-fired ceramic (LTCC) process, e.g., comprising aluminum oxide ($Al_2O_3$) may be utilized. Such embodiments may be suitable for testing comparatively lower power devices.

Wafer scale active thermal interposer device 130 is further coupled to a cold plate 140. In some embodiments, there may be a thermal interface material (not shown) disposed between wafer scale active thermal interposer device 130 and cold plate 140. Such a thermal interface material, if present, is designed to improve thermal coupling between wafer scale active thermal interposer device 130 and cold plate 140.

In an embodiment, a cooling fluid, e.g., comprising glycol, although other fluids, including air, may be used, is generally circulated through cold plate 140. To adjust the temperature of the cold plate 140, the temperature of the cooling fluid may be adjusted, in some embodiments. In some embodiments, as illustrated in FIG. 1, the flow rate of the cooling fluid may also be adjusted, e.g., increased, reduced, started, and/or stopped. For example, a speed of a pump and/or fan may be adjusted. In an embodiment, chiller 160 cools the cooling fluid, e.g., to −60 degrees C. The cooling fluid flows through 161 to valve 150. Valve 150, under the control of thermal controller 180, regulates the flow 151 of cooling fluid to cold plate 140. After cycling through cold plate 140, the cooling fluid is returned 141 to the chiller 160. In this manner, thermal controller 180 may cool wafer 120 during testing via cooling action from chiller 160 and the cold plate 140.

In accordance with embodiments of the present invention, thermal controller 180 may implement some or all of the control processes described in U.S. Pat. No. 9,291,667 entitled "Adaptive Thermal Control," incorporated herein by reference in its entirety.

In some embodiments, cold plate 140 may comprise an evaporator and/or phase change cooling system. In such embodiments, chiller 160 may comprise a compressor and/or radiator, for example.

Wafer scale active thermal interposer device 130 functions to apply heat energy to one or more temperature regions of wafer 120. There temperature regions may correspond, in location and shape, with the dice on the wafer 120. To accomplish such heating, wafer scale active thermal interposer device 130 comprises one or more heating elements, as further described below. The heating elements of wafer scale active thermal interposer device 130 correspond to the temperature regions of wafer 120. In some embodiments, the heating elements comprise resistive traces on a ceramic substrate. In some embodiments, the heating elements may be Peltier devices, capable of cooling as well. However, any suitable heating and/or cooling technology is well suited to embodiments in accordance with the present invention. Wafer scale active thermal interposer device 130 also functions to couple heat energy from wafer 120 to cold plate 140 for cooling.

Wafer scale active thermal interposer device 130 further comprises a plurality of temperature measurement devices, e.g., thermocouples. The plurality of temperature measurement devices are configured to measure temperatures of regions of wafer 120. The plurality of temperature measurement devices may be located within or in close proximity to the heating elements of wafer scale active thermal interposer device 130. In some embodiments, wafer scale active thermal interposer device 130 may comprise temperature measurement devices characterized as not within or in close proximity to the heating elements of wafer scale active thermal interposer device 130. Each of the plurality of temperature measurement devices sends a temperature signal 131 to thermal controller 180. Wafer probe card 110, wafer 120, wafer scale active thermal interposer device 130, and cold plate 140 may be collectively known as or referred to as a test stack or test head when coupled together as illustrated in FIG. 1.

Test system 100 further comprises a thermal controller 180. Thermal controller 180 is an intelligent device and sends control signals 182 to power supply 170 to supply electrical power 171 to one or more heating elements of wafer scale active thermal interposer device 130. Each heating element of wafer scale active thermal interposer device 130 may be individually controlled. Accordingly, there are typically more power signals 171 than illustrated. There may be more than one power supply, in some embodiments. Based on temperature feedback 131 from one or more of the plurality of temperature measurement devices, thermal controller 180 may control power supply 170 to change the power supplied to a heating element. Power supply 170 may change a voltage level and/or pulse width modulate a voltage supplied to a heating element to control heating of the heating element, in some embodiments. Thermal controller 180 also controls the amount of heat energy extracted 141 from cold plate 140. For example, thermal controller 180 controls the temperature of cold plate 140. Thermal controller 180 controls valve 150 based on temperature feedback 131.

It is to be appreciated that cold plate 140 extracts heat, through wafer scale active thermal interposer device 130, from substantially all of wafer 120. In addition, cold plate 140 typically has a large thermal mass, and does not change temperature quickly. Accordingly, heating elements of wafer scale active thermal interposer device 130 may often be required to overcome the cooling effect of cold plate 140. In some embodiments, different regions of a wafer 120 may be heated and/or cooled to different temperatures based on the selective heating capability of the heaters of the wafer scale active thermal interposer device 10 and the cooling function of cold plate 140. For example, one region of wafer 120 may be heated to 100 degrees C., e.g., via a heater element within wafer scale active thermal interposer device 130, while another region of wafer 120 may be allowed to cool toward the temperature of cold plate 140 with no heat applied to such region by wafer scale active thermal interposer device 130. Such differential heating and/or cooling of different regions of wafer 120 may produce a thermal gradient across or between regions of wafer 120, in some embodiments.

Figure 2:
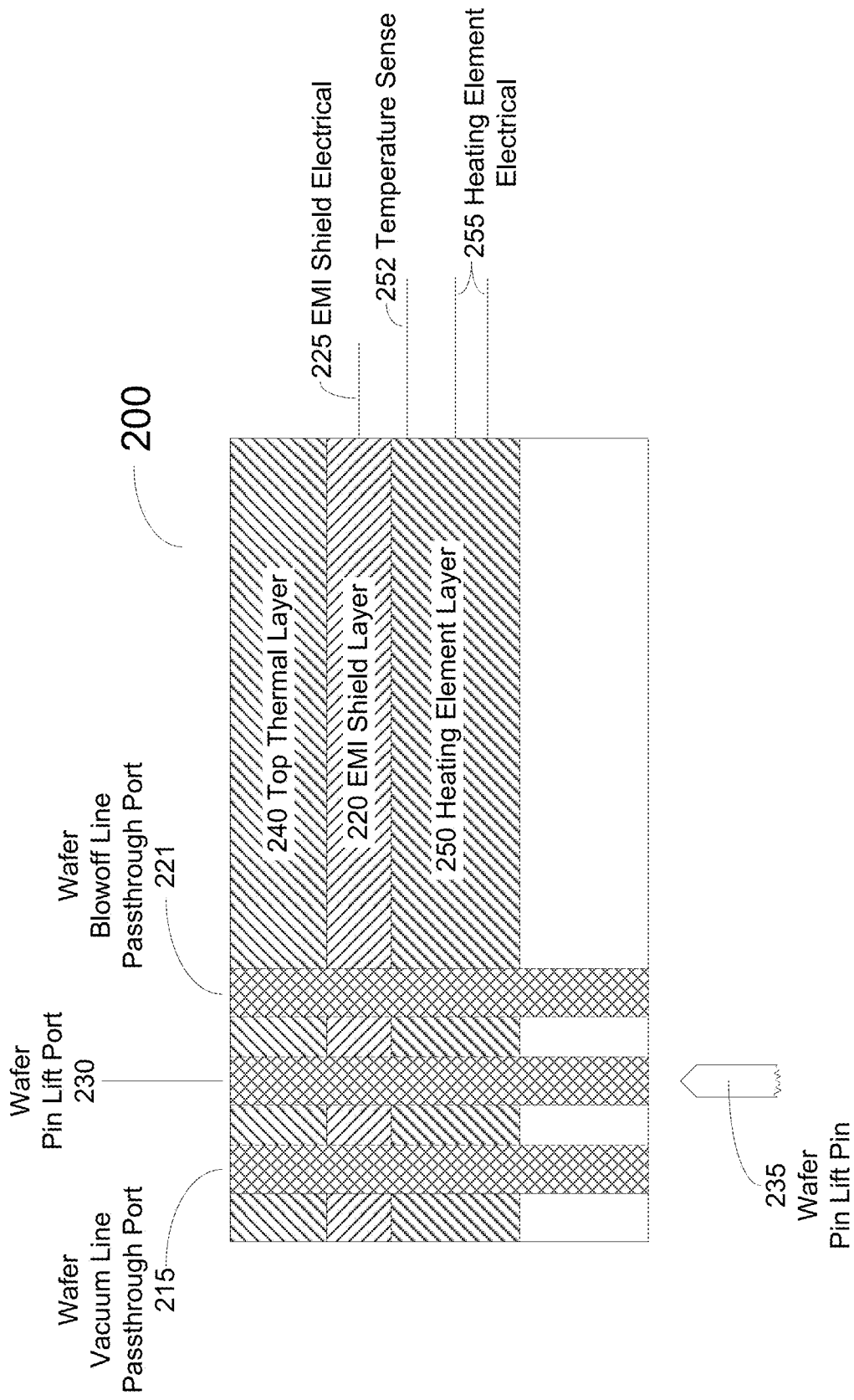
FIG. 2 illustrates an exemplary block diagram cross sectional view of a novel wafer scale active thermal interposer device, in accordance with embodiments of the present invention.

FIG. 2 illustrates an exemplary block diagram cross sectional view of a novel wafer scale active thermal interposer device 200, in accordance with embodiments of the present invention. Wafer scale active thermal interposer device 200 comprises a heating element layer 250. Heating element layer 250 comprises a plurality of discrete and separately controllable heating elements configured to apply heat energy to a wafer (not shown). The heating elements may comprise resistive traces or other suitable types of heaters. The plurality of heating elements are coupled to a plurality of electrical signals 255, for providing controlled power to the heating elements such that the elements are separately controllable. Heating element layer 250 may include low resistance traces, e.g., from electrical signals 255 to the actual heating elements, in some embodiments. Heating element layer 250 also comprises a plurality of temperature measurement devices, e.g., thermocouples, (not shown), which are coupled to control elements via temperature a plurality of sense signals 252.

In accordance with embodiments of the present invention, wafer scale active thermal interposer device 200 may comprise a novel electromagnetic interference (EMI) shield layer 220 to address signal interference caused by the heater elements. Each of the plurality of heating elements in layer 250 may utilize currents of many tens of amperes. In embodiments of the present invention that utilize switching such currents to control temperature, e.g., pulse width modulation, such switching may induce unwanted electromagnetic noise signals that are deleterious to the operation and/or test of integrated circuits on a wafer, e.g., wafer 120 of FIG. 1, coupled to the wafer scale active thermal interposer device 200. In some embodiments, EMI shield layer 220 comprises a solid layer of conductor, e.g., conductive traces similar to those utilized in heating element layer 250. In some embodiments, EMI shield layer 220 comprises a grid of conductive elements. The grid may be sized to attenuate desired wavelength(s) of electromagnetic interference. EMI shield layer 220 may have an electrical connection 225, e.g., to ground, in some embodiments.

Wafer scale active thermal interposer device 200 comprises a top thermal layer 240. Thermal layer 240 functions to couple heat energy from heating element layer 250 to a wafer under test and vice versa. Thermal layer 240 is non conductive, in some embodiments. Thermal layer 240 should have a high degree of co-planarity in order to facilitate good thermal conduction to a wafer and to promote good vacuum hold down of the wafer, in some embodiments.

Wafer scale active thermal interposer device 200 is compatible and complementary with conventional elements of wafer scale test equipment. Accordingly, in some embodiments, wafer scale active thermal interposer device 200 may comprise one or more wafer vacuum line passthrough ports 215. Wafer vacuum line passthrough ports 215 couple to one or more conventional vacuum lines, as is typically used to hold down a wafer in place during testing. For example, wafer vacuum line passthrough port 215 mates with a vacuum port of a conventional cold plate, e.g., cold plate 140 of FIG. 1. There may be a plurality of wafer vacuum line passthrough ports 215 in an instance of wafer scale active thermal interposer device 200, for example three arranged in an equilateral triangle, in some embodiments. A wafer vacuum line passthrough port 215 typically extends through wafer scale active thermal interposer device 200.

In some embodiments, wafer scale active thermal interposer device 200 may comprise one or more wafer blowoff line passthrough ports 221. Wafer blowoff line passthrough port 221 couples to a conventional wafer blowoff line, as is typically used to break a vacuum seal of a wafer, prior to removing the wafer from the test system. For example, wafer blowoff line passthrough port 221 mates with a wafer blowoff line port of a conventional cold plate, e.g., cold plate 140 of FIG. 1. There may be a plurality of wafer blowoff line passthrough ports 221 in an instance of wafer scale active thermal interposer device 200, for example three arranged in an equilateral triangle, in some embodiments. A wafer blowoff line passthrough port 221 typically extends through wafer scale active thermal interposer device 200.

Wafer scale active thermal interposer device 200 may also comprise a wafer pin lift port 230, in some embodiments. Wafer pin lift port 230 may be aligned with a similar port or channel in a cold plate, e.g., cold plate 140 of FIG. 1. Wafer pin lift port 230 enables a wafer lift pin 235 to raise a wafer above the top of the wafer scale active thermal interposer device 200. For example, wafer handling equipment typically needs a gap under a wafer in order to lift the wafer and move the wafer to another station in a wafer manufacturing and test process. The wafer lift pin 235 typically extends from or through a cold plate, e.g., cold plate 140 of FIG. 1, and/or from a chuck mechanism (not shown). In accordance with some embodiments of the present invention, the wafer lift pin 235 may be lengthened, in contrast to a conventional lift pin, to account for the thickness of wafer scale active thermal interposer device 200. There may be a plurality of wafer pin lift ports 230 in an instance of wafer scale active thermal interposer device 200, for example three arranged in an equilateral triangle, in some embodiments. A wafer pin lift port 230 typically extends through wafer scale active thermal interposer device 200.

With respect to the wafer scale active thermal interposer device 200, wafer vacuum line passthrough ports 215, wafer blowoff line passthrough ports 221 and/or wafer pin lift ports 230 may be combined in any suitable combination, in accordance with embodiments of the present invention. For example, a wafer vacuum line passthrough ports 215 may be combined with a wafer blowoff line passthrough port 221.

Figure 3:
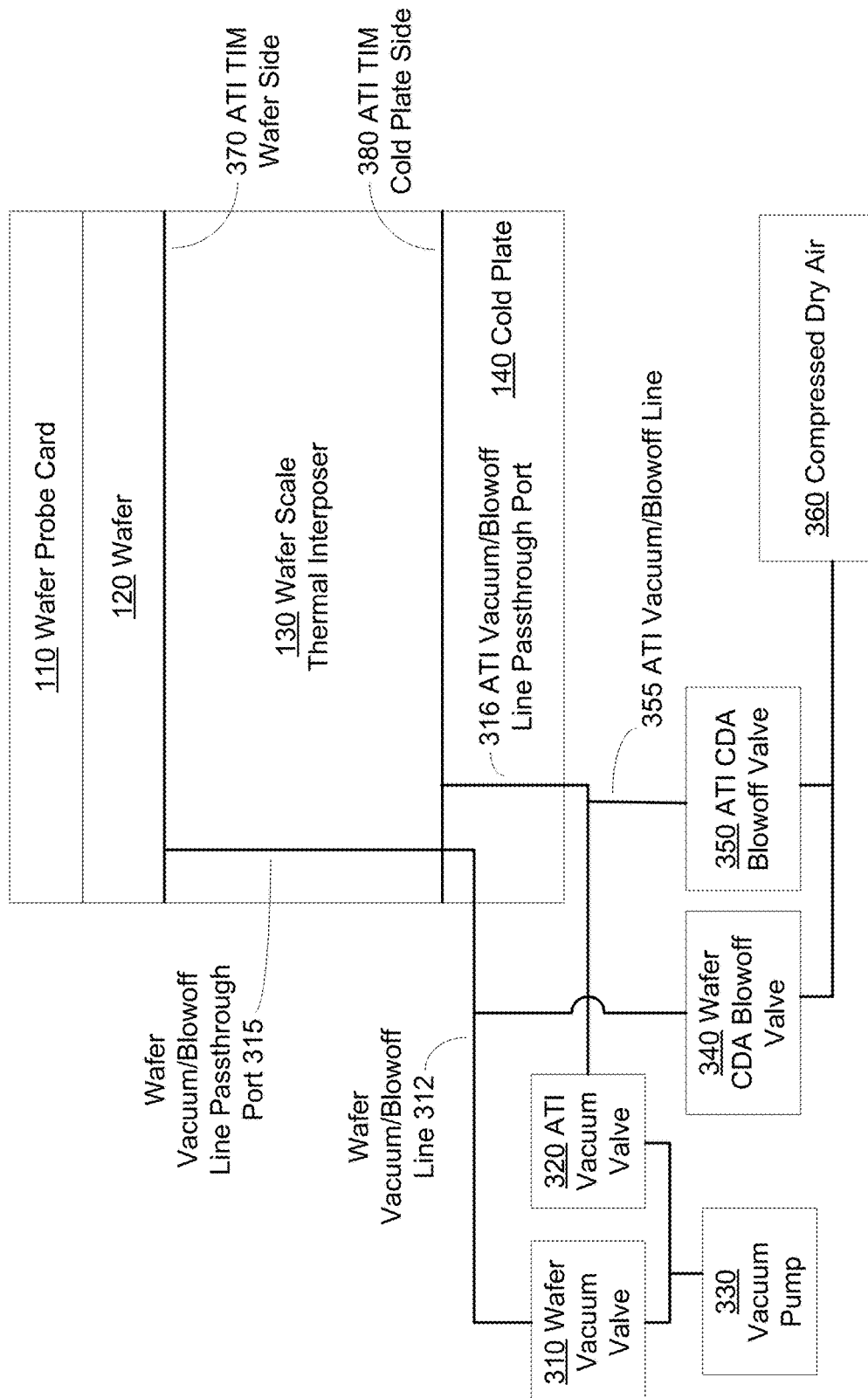
FIG. 3 illustrates an exemplary block diagram of elements of an automated test system environment including a wafer scale active thermal interposer device, in accordance with embodiments of with the present invention.

FIG. 3 illustrates an exemplary block diagram of elements of an automated test system environment 300 including a wafer scale active thermal interposer device, in accordance with embodiments of with the present invention. FIG. 3 illustrates functional components of a wafer vacuum hold down and blowoff systems in combination with wafer scale active thermal interposer device 130.

Test system environment 300 comprises a vacuum pump 330 coupled to wafer vacuum valve 310 and wafer scale active thermal interposer (ATI) vacuum valve 320. Wafer vacuum valve 310 is coupled to wafer vacuum/blowoff line passthrough port 315 of wafer scale active thermal interposer device 130. In the illustrated embodiment, the vacuum passthrough and blowoff passthrough ports are combined, although this is not required and such ports may be separate.

To hold down a wafer 120 prior to and during test, wafer vacuum valve 310 is opened, enabling a pressure differential between ambient atmosphere and vacuum to hold down the wafer 120 to the wafer scale active thermal interposer device 130.

ATI vacuum valve 320 is coupled to ATI vacuum/blowoff line passthrough port 316 of cold plate 140. To hold down ATI 130 prior to and during test, ATI vacuum valve 320 is opened, enabling a pressure differential between ambient atmosphere and/or ATI 130 and vacuum to hold down the ATI 130 to the cold plate 140.

Compressed dry air source (CDA) 360 is coupled to wafer CDA blowoff valve 340 and to ATI CDA blowoff valve 350. To blow the wafer off of the ATI 130, the wafer vacuum valve 310 is closed and the wafer CDA blowoff valve 340 is opened, coupling compressed dry air through the vacuum/blowoff line passthrough port 315 to break the prior vacuum seal. To remove the wafer scale active thermal interposer device 130 from the cold plate 140, for example, to change to a different wafer scale thermal interposer, the ATI vacuum valve 320 is closed and the ATI CDA blowoff valve 350 is opened, coupling compressed dry air through the ATI vacuum/blowoff line passthrough port 316 to break the prior vacuum seal.

In accordance with embodiments of the present invention, test system 300 may comprise a thermal interface material (TIM) 370 disposed at the ATI/wafer interface and/or a thermal interface material 380 disposed at the ATI/cold plate interface. The thermal interface material is operable to provide thermal coupling, e.g., has a high thermal conductance, and provides mechanical compliance to compensate for irregularities in the adjoining surfaces. The thermal interface material may be considered to be separate from the wafer scale active thermal interposer device 130, in some embodiments. For example, a thermal interface material 370 may be applied to the wafer scale active thermal interposer device 130 after the wafer scale active thermal interposer device 130 is placed in the test system 300. Any suitable thermal interface material may be used, including those comprising indium foil and/or carbon nanotubes, in accordance with embodiments of the present invention. Thermal interface material 370 may differ from thermal interface material 380 in composition and/or thickness, in some embodiments.

Figure 4:
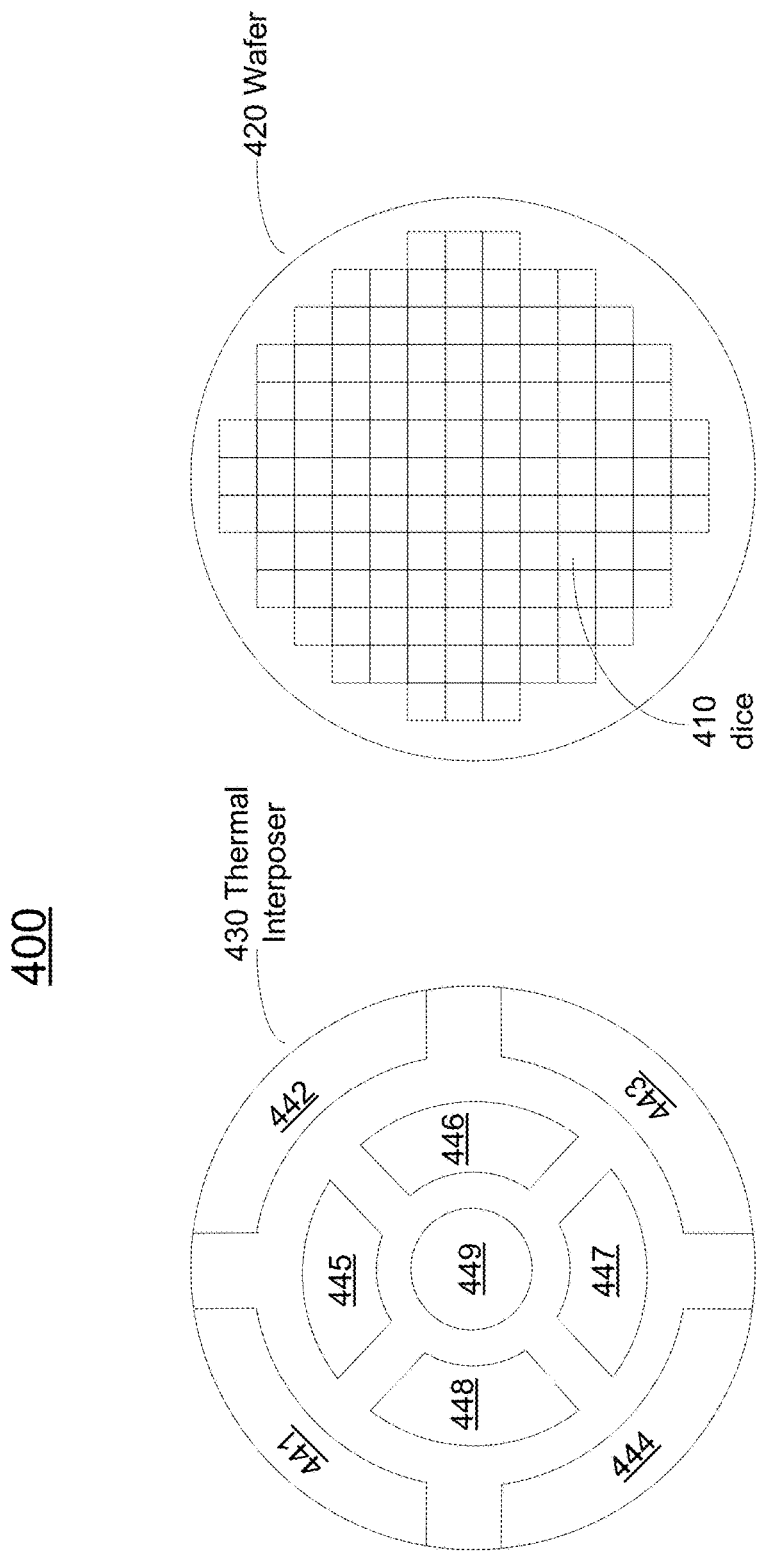
FIG. 4 illustrates an exemplary plan view of an exemplary layout of controllable regions of a wafer scale active thermal interposer device and an associated exemplary wafer, in accordance with embodiments of the present invention.

FIG. 4 illustrates an exemplary plan view layout of an exemplary layout 400 of controllable regions of a wafer scale active thermal interposer device 430 and an associated exemplary wafer 420, in accordance with embodiments of the present invention. The wafer scale active thermal interposer device 430 generally corresponds to wafer scale active thermal interposer device 130 as previously described in FIGS. 1, 2, and 3. The wafer scale active thermal interposer device 430 is configured to be used in testing of wafer 420.

Wafer 420 comprises a plurality of discrete dice 410. Dice 410 may be characterized as relatively small and/or designed to operate at relatively low power levels. Examples of such integrated circuits may include microcontrollers, dynamic RAMs, application-specific integrated circuits, and the like. Due to their small size and/or low power operational characteristics, such integrated circuits may not require application of large amounts of heat energy to achieve desired test temperatures. In addition, small integrated circuit die may be physically smaller than a desired minimum size of a heating element as used in wafer scale active thermal interposer device 430.

Wafer scale active thermal interposer device 430 comprises a plurality of selective heatable regions 441, 442, 443, 444, 445, 446, 447, 448 and 449. The number of heatable regions and their layout is exemplary, and may be customized to the die layout of the wafer 420. Wafer scale active thermal interposer device 430 is configured to heat and/or cool portions of wafer 420 corresponding to one or more of the selective heatable regions 441, 442, 443, 444, 445, 446, 447, 448 and 449. In accordance with embodiments of the present invention, each heatable region of wafer scale active thermal interposer device 430 corresponds to more than one die of wafer 420. For example, heatable region 449 of wafer scale active thermal interposer device 430 is configured to selectively apply heat energy to approximately nine dice of wafer 420 when coupled to wafer 420 in a test system.

Figure 5:
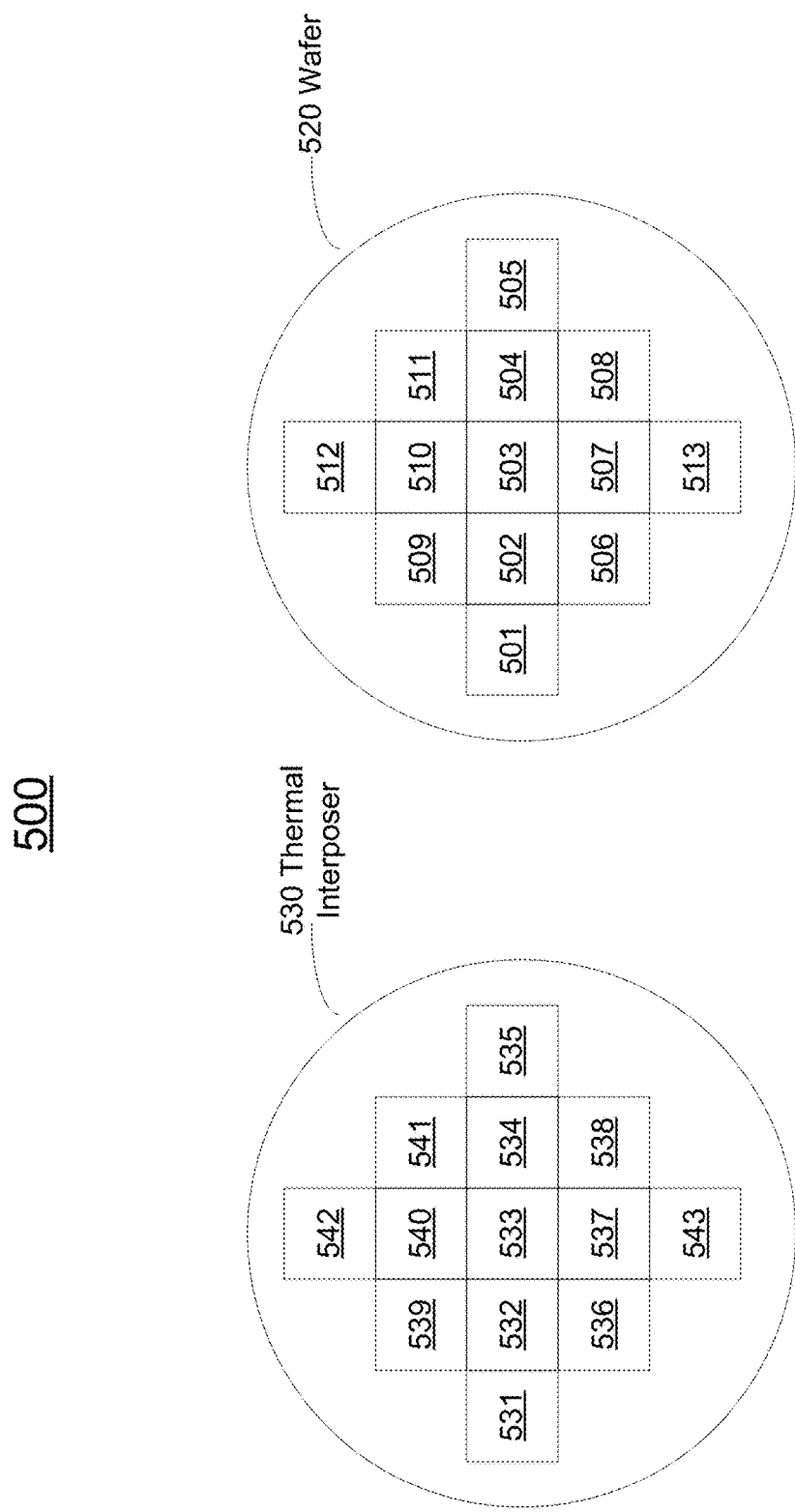
FIG. 5 illustrates an exemplary plan view layout of controllable regions of a wafer scale active thermal interposer device and an associated wafer, in accordance with embodiments of the present invention.

FIG. 5 illustrates an exemplary plan view layout 500 of controllable regions of an exemplary wafer scale active thermal interposer device 530 and an associated exemplary wafer 520, in accordance with embodiments of the present invention. The wafer scale active thermal interposer device 530 generally corresponds to wafer scale active thermal interposer device 130 as previously described in FIGS. 1, 2, and 3. The wafer scale active thermal interposer device 530 is configured to be used in testing of wafer 520.

Wafer 520 comprises a plurality of dice 510. Dice 510 may be characterized as relatively large and/or designed to operate at relatively high power levels. Examples of such integrated circuits may include central processing units (CPUs), graphics processing units (GPUs), Network Processing Units (NPUs), multi-core processing units, power semiconductors, and the like. Due to their large size and/or high power operational characteristics, such integrated circuits may require application of large amounts of heat energy to achieve desired test temperatures.

Wafer scale active thermal interposer device 530 comprises a plurality of selectable heatable regions 531, 532, 533, 534, 535, 536, 537, 538, 539, 540, 541, 542, and 543. The number of heatable regions and their layout is exemplary. Wafer scale active thermal interposer device 530 is configured to heat and/or cool portions of wafer 520 corresponding to one or more of the heatable regions 531, 532, 533, 534, 535, 536, 537, 538, 539, 540, 541, 542, and 543. In accordance with embodiments of the present invention, each heatable region of wafer scale active thermal interposer device 530 corresponds to one die of wafer 520 in location and shape. For example, heatable region 542 of wafer scale active thermal interposer device 530 is configured to selectively apply heat energy to die 512 of wafer 520 when coupled to wafer 520 in a test system. In this novel manner, wafer scale active thermal interposer device 530 may selectively apply sufficient heat energy to large and/or high-power die to achieve desired test temperatures while in wafer form. The discrete dice of the wafer 520 may be selectively heated during testing by the discrete and separately controller heating elements of the wafer scale active thermal interposer device 530.

Figure 6:
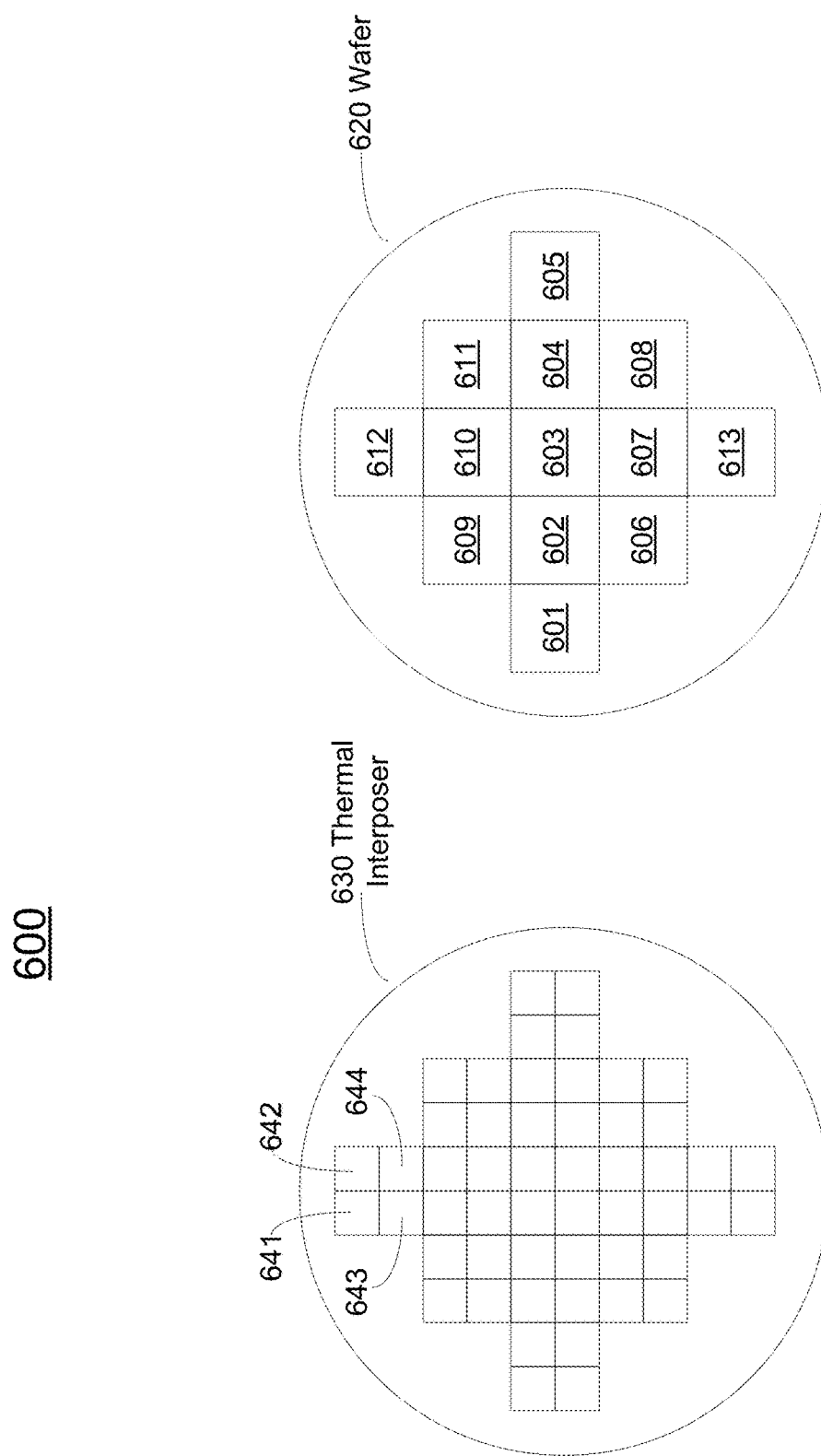
FIG. 6 illustrates an exemplary plan view layout of controllable regions of a wafer scale active thermal interposer device and an associated wafer, in accordance with embodiments of the present invention.

FIG. 6 illustrates an exemplary plan view layout 600 of controllable regions of a wafer scale active thermal interposer device 630 and an associated wafer 620, in accordance with embodiments of the present invention. The wafer scale active thermal interposer device 630 generally corresponds to wafer scale active thermal interposer device 130 as previously described in FIGS. 1, 2, and 3. The wafer scale active thermal interposer device 630 is configured to be used in testing of wafer 620.

Wafer 620 comprises a plurality of dice 601, 602, 603, 604, 605, 606, 607, 608, 609, 610, 611, 612, and 613. Dice 601, 602, 603, 604, 605, 606, 607, 608, 609, 610, 611, 612, and 613 may be characterized as relatively large and/or designed to operate at relatively high power levels. Examples of such integrated circuits may include central processing units (CPUs), graphics processing units (GPUs), Network Processing Units (NPUs), multi-core processing units, power semiconductors, and the like. Due to their large size and/or high power operational characteristics, such integrated circuits may require application of large amounts of heat energy to achieve desired test temperatures.

Large and complex integrated circuits frequently comprise a plurality of functional units, e.g., multiple processing cores, which are physically distinct. It may be desirable to test such functional units in whole or in partial isolation from other function units of a die. For example, a GPU comprising multiple floating point units may be designed to utilize a single floating point unit at times during operation, and turn off other floating point units, e.g., those that are not currently required, in order to reduce power consumption. It may be desirable to test the GPU under similar thermal conditions. For example, it may be desirable to run functional tests on a portion of the GPU corresponding to an operational floating point unit at a high temperature, while other portions of the GPU are at a different, e.g., lower, temperature, simulating non-operation.

In addition, the heat energy required to achieve a desirable test temperature for large and/or high powered die may exceed the capacity of a single heating element of a wafer scale thermal interposer. For example, conductive traces of a wafer scale thermal interposer may have current capacity limitations. Further, other components of a single heating element and/or a wafer scale thermal interposer may limit an amount of heat energy generated to be less that required to supply sufficient heat energy to achieve a desired temperature of a die under test.

Wafer scale active thermal interposer device 630 comprises a plurality of heatable regions, e.g., heatable regions 641, 642, 643, and 644. The number of heatable regions and their layout is exemplary. Wafer scale active thermal interposer device 630 is configured to selectively heat and/or cool portions of wafer 620 corresponding to one or more of the heatable regions 641, 642, 643, and 644. In accordance with embodiments of the present invention, each heatable region of wafer scale active thermal interposer device 630 corresponds to a portion of one die of wafer 620. For example, heatable region 642 of wafer scale active thermal interposer device 630 is configured to selectively apply heat energy to the right upper quadrant of die 612 of wafer 620 when coupled to wafer 620 in a test system. In this novel manner, wafer scale active thermal interposer device 630 may selectively apply sufficient heat energy to portions of large and/or high-power die to achieve desired test temperatures, including different temperatures within a single die, while in wafer form.

In accordance with embodiments of the present invention, areas of a wafer, e.g., wafer 620 of FIG. 6, which are not under test may nevertheless be opportunistically preconditioned to a desirable temperature. For example, while testing die 612 (FIG. 6) at a desired testing temperature, embodiments in accordance with the present invention may bring die 609 to a desired test temperature while die 609 is not being tested, e.g., prior to testing die 609. It is appreciated that semiconductor die have a thermal mass, and do not change temperature instantaneously. In this novel manner, a plurality of die may be opportunistically preconditioned to a desirable temperature, e.g., in advance of their testing, to increase testing throughput. Such opportunistic temperature preconditioning may beneficially increase a rate of testing of multiple dice, for example, by eliminating a time delay between testing of a first and a second die required to bring the second die, or portion thereof, to a desirable test temperature.

Figure 7A:
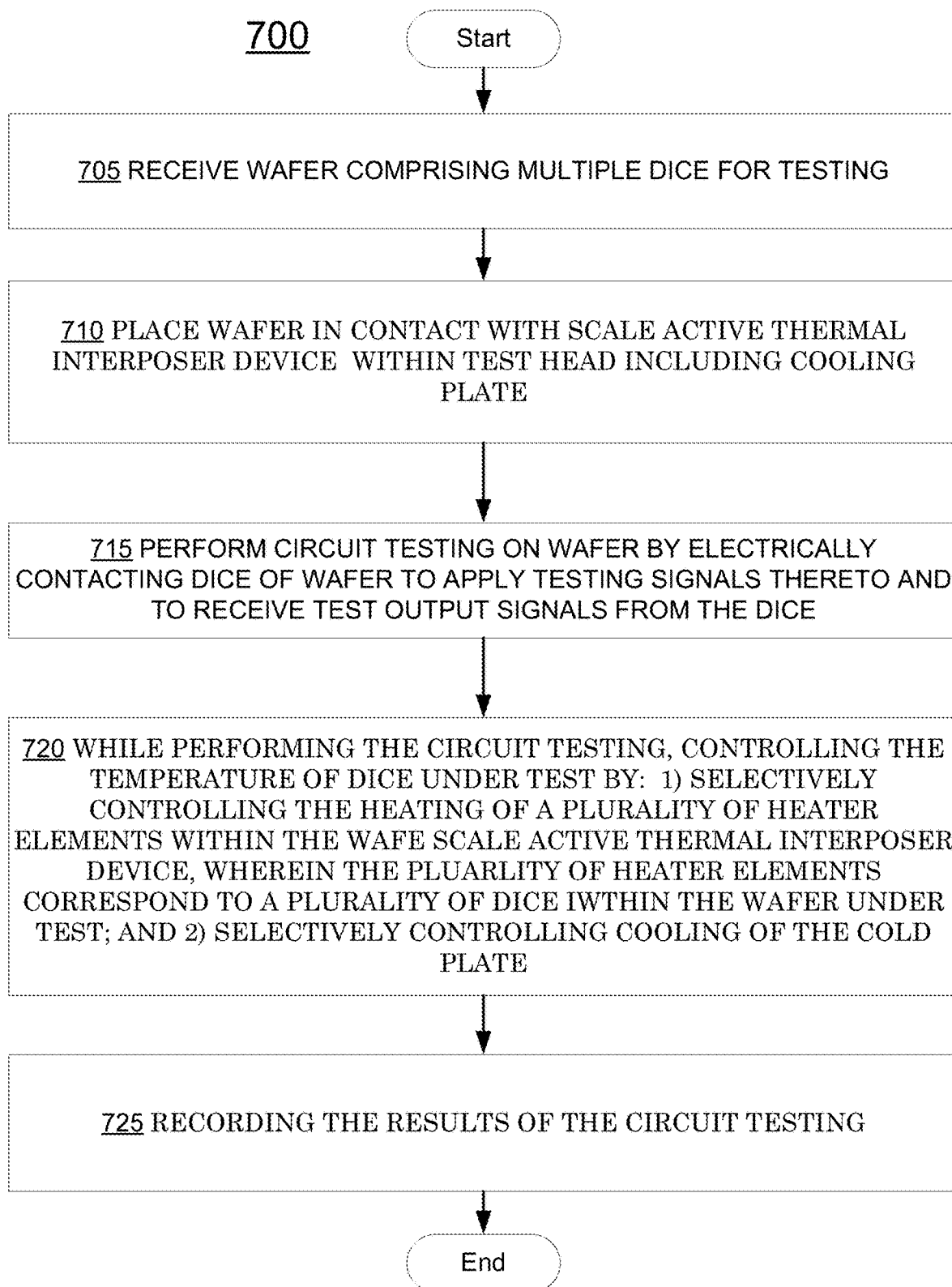
FIG. 7A illustrates an exemplary computer controller process for testing circuits of an integrated circuit semiconductor wafer comprising multiple integrated circuit dice using a wafer scale active thermal interposer device, in accordance with embodiments of the present invention.

FIG. 7A illustrates an exemplary computer controller process 700 for testing circuits of an integrated circuit semiconductor wafer comprising multiple integrated circuit dice using a wafer scale active thermal interposer device, in accordance with embodiments of the present invention. In 705, a wafer comprising multiple dice for testing is received for testing, e.g., within an automated test equipment, for example, automated test environment 100 of FIG. 1.

In 710, a wafer, e.g., wafer 120 of FIG. 1, is placed in contact with a wafer scale active thermal interposer device, e.g., wafer scale active thermal interposer device 130 (FIG. 1). In 715, circuit testing is performed on the wafer by electrically contacting dice of the wafer to apply testing signals thereto and to receive test output signals from the dice.

In 720, while performing the circuit testing, the temperature of dice under test is controlled by: 1) selectively controlling the heating of a plurality of heater elements within the wafer scale active thermal interposer device, wherein the plurality of heater elements correspond to a plurality of dice within the wafer under test, and 2) selectively controlling cooling of the cold plate. In optional 725, the results of the circuit testing are recorded.

FIG. 7B illustrates an exemplary computer controlled method 750 for testing circuits of an integrated circuit semiconductor wafer using a wafer scale active thermal interposer device, in accordance with embodiments of the present invention. In 755, the circuits of a wafer are tested by using a tester system to generate signals for input to the circuits and to process output signals from the circuits.

In 760, in conjunction with the testing, a plurality of areas of the wafer are selectively heated and have their temperatures maintained by using a thermal controller selectively controlling discrete heater elements of a thermal interposer layer and a cold plate, both disposed in proximity of the wafer. The thermal interposer comprises a plurality of separately controllable thermal zones wherein each thermal zone is operable to be selectively heated and temperature maintained by the thermal controller. The thermal zones may correspond in location and shape to dice on the wafer being tested. The selective heating may include bringing a first set of thermal zones of the plurality of separately controllable thermal zones to a testing temperature while the tester system is testing a first die of the die layout corresponding to the first set of thermal zones, simultaneously and opportunistically bringing a second set of thermal zones of plurality of separately controllable thermal zones to a testing temperature in advance of testing a second die of the die layout corresponding to the second set of thermal zones.

In optional 765, a first thermal zone of the plurality of separately controllable thermal zones is brought to a testing temperature. In optional 770, a second thermal zone of the plurality of separately controllable thermal zones to is simultaneously brought to a testing temperature in advance of testing one or more die of the die layout corresponding to the second thermal zone, while the tester system is testing one or more die of the die layout corresponding to the first thermal zone. In optional 775, one or more die of the die layout corresponding to the second thermal zone are tested.

Figure 8:
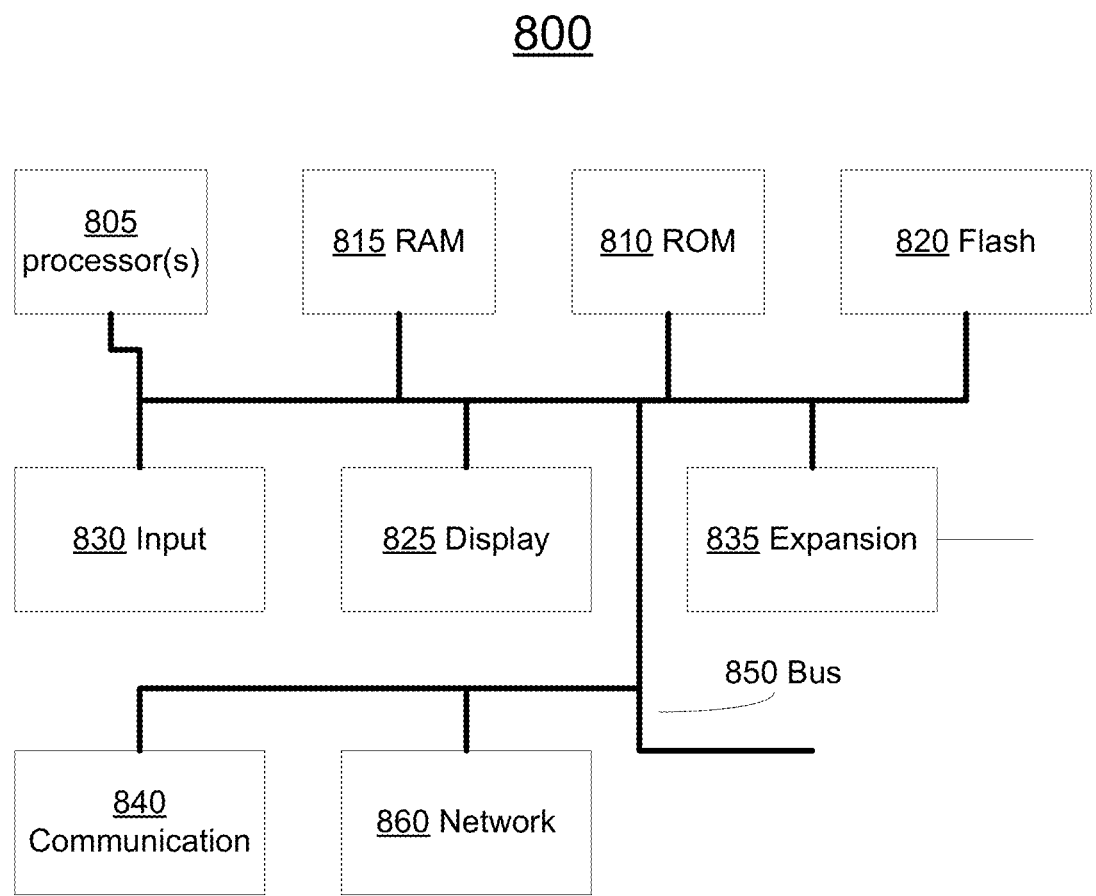
FIG. 8 illustrates a block diagram of an exemplary electronic system, which may be used as a platform to implement and/or as a control system for embodiments of the present invention.

FIG. 8 illustrates a block diagram of an exemplary electronic system 800, which may be used as a platform to implement and/or as a control system for embodiments of the present invention. Electronic system 800 may be a "server" computer system, in some embodiments. Electronic system 800 includes an address/data bus 850 for communicating information, a central processor complex 805 functionally coupled with the bus for processing information and instructions. Bus 850 may comprise, for example, a Peripheral Component Interconnect Express (PCIe) computer expansion bus, industry standard architecture (ISA), extended ISA (EISA), MicroChannel, Multibus, IEEE 796, IEEE 1196, IEEE 1496, PCI, Computer Automated Measurement and Control (CAMAC), MBus, Runway bus, Compute Express Link (CXL), and the like.

Central processor complex 805 may comprise a single processor or multiple processors, e.g., a multi-core processor, or multiple separate processors, in some embodiments. Central processor complex 805 may comprise various types of well known processors in any combination, including, for example, digital signal processors (DSP), graphics processors (GPU), complex instruction set (CISC) processors, reduced instruction set (RISC) processors, and/or very long word instruction set (VLIW) processors. Electronic system 800 may also includes a volatile memory 815 (e.g., random access memory RAM) coupled with the bus 850 for storing information and instructions for the central processor complex 805, and a non-volatile memory 810 (e.g., read only memory ROM) coupled with the bus 850 for storing static information and instructions for the processor complex 805. Electronic system 800 also optionally includes a changeable, non-volatile memory 820 (e.g., NOR flash) for storing information and instructions for the central processor complex 805 which can be updated after the manufacture of system 800. In some embodiments, only one of ROM 810 or Flash 820 may be present.

Also included in electronic system 800 of FIG. 8 is an optional input device 830. Device 830 can communicate information and command selections to the central processor 800. Input device 830 may be any suitable device for communicating information and/or commands to the electronic system 800. For example, input device 830 may take the form of a keyboard, buttons, a joystick, a track ball, an audio transducer, e.g., a microphone, a touch sensitive digitizer panel, eyeball scanner, and/or the like.

Electronic system 800 may comprise a display unit 825. Display unit 825 may comprise a liquid crystal display (LCD) device, cathode ray tube (CRT), field emission device (FED, also called flat panel CRT), light emitting diode (LED), plasma display device, electro-luminescent display, electronic paper, electronic ink (e-ink) or other display device suitable for creating graphic images and/or alphanumeric characters recognizable to the user. Display unit 825 may have an associated lighting device, in some embodiments.

Electronic system 800 also optionally includes an expansion interface 835 coupled with the bus 850. Expansion interface 835 can implement many well known standard expansion interfaces, including without limitation the Secure Digital Card interface, universal serial bus (USB) interface, Compact Flash, Personal Computer (PC) Card interface, CardBus, Peripheral Component Interconnect (PCI) interface, Peripheral Component Interconnect Express (PCI Express), mini-PCI interface, IEEE 8394, Small Computer System Interface (SCSI), Personal Computer Memory Card International Association (PCMCIA) interface, Industry Standard Architecture (ISA) interface, RS-232 interface, and/or the like. In some embodiments of the present invention, expansion interface 835 may comprise signals substantially compliant with the signals of bus 850.

A wide variety of well-known devices may be attached to electronic system 800 via the bus 850 and/or expansion interface 835. Examples of such devices include without limitation rotating magnetic memory devices, flash memory devices, digital cameras, wireless communication modules, digital audio players, and Global Positioning System (GPS) devices.

System 800 also optionally includes a communication port 840. Communication port 840 may be implemented as part of expansion interface 835. When implemented as a separate interface, communication port 840 may typically be used to exchange information with other devices via communication-oriented data transfer protocols. Examples of communication ports include without limitation RS-232 ports, universal asynchronous receiver transmitters (UARTs), USB ports, infrared light transceivers, ethernet ports, IEEE 8394, and synchronous ports.

System 800 optionally includes a network interface 860, which may implement a wired or wireless network interface. Electronic system 800 may comprise additional software and/or hardware features (not shown) in some embodiments.

Various modules of system 800 may access computer readable media, and the term is known or understood to include removable media, for example, Secure Digital ("SD") cards, CD and/or DVD ROMs, diskettes and the like, as well as non-removable or internal media, for example, hard drives, solid state drive s (SSD), RAM, ROM, flash, and the like.

Embodiments in accordance with the present invention provide systems and methods for wafer scale active thermal interposer devices. In addition, embodiments in accordance with the present invention provide systems and methods for wafer scale active thermal interposer devices operable to control different portions of a wafer to different temperatures. Further, embodiments in accordance with the present invention provide systems and methods for wafer scale active thermal interposer devices that are compatible and complementary with existing systems and methods of testing integrated circuits.

Various embodiments of the invention are thus described. While the present invention has been described in particular embodiments, it should be appreciated that the invention should not be construed as limited by such embodiments, but rather construed according to the below claims.

What is claimed is:

1. A test stack for use in testing circuits of an integrated circuit component, the test stack comprising:
   an active thermal interposer comprising:
   a top surface configured to receive said integrated circuit component in proximity thereto;
   a bottom surface configured to be placed upon a cold plate:
   a plurality of independently controllable thermal zones comprising a plurality of independently controllable heating zones configured to maintain or change temperatures on the top surface; and
   a plurality of healing elements, associated with said plurality of independently controllable heating zones, contained between said top and bottom surfaces;
   a plurality of indepndently controllable cooling zones configured to maintain or change temperatures on the top surface; and
   a power input configured to receive electrical power and wherein said electrical power is configured to be selectively applied to one or more of the plurality of independently controllable heating zones.

2. The test stack as described in claim 1 wherein the electrical power is supplied by a power supply device coupled to said power input and wherein said power supply device selectively applies said electrical power using pulse width modulation (PWM).

3. The test stack as described in claim 1 wherein temperatures maintained or changed on said top surface are operable to cause maintaining or changing of temperatures of said component disposed in proximity to said top surface.

4. The test stack as described in claim 3 wherein said component is a semiconductor wafer comprising a plurality of discrete dice and wherein further said plurality of discrete dice comprises at least one integrated circuit die device under test (DUT).

5. The test stack as described in claim 4 further comprising a wafer thermal interposer (TI) having a top surface configured to be disposed adjacent to the semiconductor wafer and configured to be electrically coupled to ground.

6. The test stack as described in claim 1 further comprising a wafer probe and wherein the wafer probe is configured to electrically couple to a device under test (DUT) of said component during testing thereof.

7. The test stack as described in claim 1 further comprising a wafer thermal interposer (TI) comprising:
a first conductive layer comprising said plurality of independently controllable heating zones, wherein said plurality of independently controllable heating zones comprise one or more resistive traces configured as heat producing elements; and
a second conductive layer configured as an electromagnetic interference (EMI) shield layer, wherein the shield layer is located closer to said top surface than the first conductive layer and is electrically coupled to ground.

8. The test stack as described in claim 7 wherein the first conductive layer of said wafer TI further comprises a plurality of heat sensing elements.

9. The test stack as described in claim 7 wherein the wafer TI is formed from two or more substrates.

10. The test stack described in claim 1 wherein said component is a wafer device under test (DUT) and further comprising:
a wafer probe configured to probe circuits of the wafer DUT by probing a first surface of said wafer DUT;
a wafer thermal interposer (TI) configured to be disposed in proximity to a second surface of said wafer DUT and further configured to selectively heat areas of said wafer DUT during testing thereof, said wafer TI comprising said plurality of independently controllable heating zones;
a cold plate configured to be disposed in proximity to said wafer TI and configured to selectively cool said wafer DUT; and
a thermal controller configured to control selective heating of said wafer TI and configured to control selective cooling of said cold plate.

11. The test stack as described in claim 10 wherein said cold plate and said wafer TI, in combination, under control of said thermal controller, implement said plurality of independently controllable cooling zones.

12. The test stack as described in claim 10 wherein said plurality of independently controllable heating zones comprises a plurality of resistive traces configured to emit heat responsive to application of said electrical power thereto.

13. The test stack as described in claim 12 wherein said wafer TI further comprises a shield layer disposed to protect said wafer DUT from electromagnetic interference from said plurality of resistive traces and wherein said shield layer is configured to be grounded.

14. The test stack as described in claim 10 wherein said thermal controller is configured to control electrical power selectively supplied to one or more of said plurality of independently controllable thermal zones to individually control heat produced therefrom.

15. The test stack as described in claim 10 wherein said wafer TI further comprises a plurality of temperature measurement devices configured to measure temperatures of said areas of said wafer DUT.

16. The test stack as described in claim 10 further comprising:
a first thermal interface material (TIM) layer disposed between said cold plate and said wafer TI; and
a second TIM layer disposed between said wafer TI and said wafer DUT.

17. The test stack as described in claim 10 wherein said thermal controller is configured to alter a flow rate of coolant fluid to said cold plate.

18. The test stack as described in claim 10 wherein said thermal controller is configured to alter a temperature of coolant fluid flowing to said cold plate.

19. The test stack as described in claim 10 wherein said thermal controller is configured to alter and maintain temperature of a respective thermal zone of said plurality of independently controllable thermal zones by adjusting power supplied to said respective thermal zone and also by adjusting coolant fluid flow to said cold plate, or both.

20. A method of testing an integrated circuit component, said method comprising:
testing said component by applying signals thereto and comparing results therefrom; and
regulating temperatures of said integrated circuit component during said testing, said regulating temperatures using a test stack, wherein the test stack comprises:
an active thermal interposer comprising:
a top surface configured to receive said integrated circuit component in proximity thereto;
a bottom surface nfigured to be placed upon a cold plate;
a plurality of independently controllable thermal zones comprising a plurality of independently controllable heating zones configured to maintain or change temperatures on the top surface; and
a plurality of heating elements, assocaited with said plurality of independently controllable heating zones, contained between said top and bottom surfaces;
a plurality of independently controllable cooling zones configured to maintain of change temperatures on the top surface: and
a power input configured to receive electrical power and wherein said electrical power is configured to be selectively applied to one or more of the plurality of independently controllable heating zones.

21. The method as described in claim 20 wherein said regulating temperatures comprises supplying the electrical power using a power supply device coupled to said power input and wherein further the supplying electrical power comprises selectively applying said electrical power using pulse width modulation (PWM).

22. The method as described in claim 20 wherein said component is a semiconductor wafer and wherein said semiconductor wafer comprises a plurality of discrete dice.

23. The method as described in claim 22 wherein said test stack further comprises a wafer thermal interposer (TI) having a top surface configured to be electrically coupled to ground and wherein said regulating temperatures further comprises disposing said semiconductor wafer in proximity to said top surface.

24. The method as described in claim 20 wherein said test stack further comprises a wafer probe and wherein said testing comprises probing said component using said wafer probe.

25. The method as described in claim 20 wherein said test stack further comprises a wafer thermal interposer (TI) comprising:
   a first conductive layer comprising said plurality of independently controllable heating zones, wherein said plurality of independently controllable heating zones comprise one or more resistive traces configured as heat producing elements; and
   a second conductive layer configured as an electromagnetic interference (EMI) shield layer, wherein the shield layer is disposed to shield said top surface from EMI from said first conductive layer and is further electrically coupled to ground.

26. The method as described in claim 25 wherein the first conductive layer of said wafer TI further comprises a plurality of temperature measuring devices.

27. The method as described in claim 20 wherein said test stack further comprises:
   a wafer probe configured to probe circuits of said component by probing a first surface thereof;
   a wafer thermal interposer (TI) configured to be disposed in proximity to a second surface of said component and further configured to selectively heat areas of said component during said testing, said wafer TI comprising said plurality of independently controllable heating zones;
   a cold plate configured to be disposed in proximity to said wafer TI and configured to selectively cool said component; and
   a thermal controller configured to control selective heating of said wafer TI and configured to control selective cooling of said cold plate.

28. The method as described in claim 27 wherein said regulating temperatures comprises using said thermal controller to control electrical power selectively supplied to one or more of said plurality of independently controllable thermal zones to individually control heat produced therefrom and wherein further said plurality of independently controllable heating zones comprises a plurality of resistive traces configured to emit heat responsive to said supplying the electrical power.

29. The method as described in claim 27 wherein said test stack further comprises:
   a first thermal interface material (TIM) layer disposed between said cold plate and said wafer TI; and
   a second TIM layer disposed between said wafer TI and said component.

30. The method as described in claim 27 wherein said regulating temperatures comprises altering and maintaining temperatures of a respective thermal zone of said plurality of independently controllable thermal zones using said thermal controller adjusting power supplied to said respective thermal zone and also adjusting coolant fluid flow to said cold plate, or both.

* * * * *